(12) United States Patent
Sokol et al.

(10) Patent No.: US 10,372,834 B2
(45) Date of Patent: Aug. 6, 2019

(54) CREATING AND USING AN INTEGRATED TECHNICAL DATA PACKAGE

(71) Applicant: DISCUS Software Company, Columbus, OH (US)

(72) Inventors: Dan Z. Sokol, Dayton, OH (US); Randy Harris, Centerville, OH (US); Robert Roush, Urbana, OH (US); Randy Strobel, Tipp City, OH (US)

(73) Assignee: Discus Software Company, Columbus, OH (US)

( * ) Notice: Subject to any disclaimer, the term of this patent is extended or adjusted under 35 U.S.C. 154(b) by 367 days.

(21) Appl. No.: 14/996,356

(22) Filed: Jan. 15, 2016

(65) Prior Publication Data
US 2017/0206237 A1    Jul. 20, 2017

(51) Int. Cl.
G06F 17/00     (2019.01)
G06F 17/50     (2006.01)
G06Q 10/10     (2012.01)

(52) U.S. Cl.
CPC .......... *G06F 17/50* (2013.01); *G06Q 10/101* (2013.01)

(58) Field of Classification Search
None
See application file for complete search history.

(56) References Cited

U.S. PATENT DOCUMENTS

| | | |
|---|---|---|
| 6,317,643 B1 | 11/2001 | Dmochowski |
| 6,405,211 B1 | 6/2002 | Sokol et al. |
| 6,552,248 B1 * | 4/2003 | Baszczynski ............ C12N 9/00 435/419 |
| 6,600,964 B2 | 7/2003 | Hess et al. |
| 6,658,428 B2 | 12/2003 | Sokol et al. |
| 7,130,707 B2 | 10/2006 | Chao et al. |
| 7,174,230 B2 | 2/2007 | Arackaparambil et al. |
| 7,181,301 B2 | 2/2007 | Becker et al. |
| 7,321,804 B2 | 1/2008 | Zayic et al. |
| 7,471,989 B2 | 12/2008 | Hansen et al. |
| 7,487,005 B2 | 2/2009 | Kakino et al. |
| 7,610,112 B2 | 10/2009 | Knipfer et al. |
| 7,801,754 B2 | 9/2010 | Kasper et al. |
| 8,065,252 B2 | 11/2011 | Li et al. |
| 8,095,229 B2 | 1/2012 | Muser et al. |
| 8,108,418 B2 | 1/2012 | Burkey et al. |

(Continued)

*Primary Examiner* — Hung D Le
(74) *Attorney, Agent, or Firm* — Wood Herron & Evans LLP

(57) ABSTRACT

Systems and methods include generating an integrated technical data package that incorporates a plurality of objects associated with a development of a product so that each object is integrated with other objects based on a relationship between each of the objects. Embodiments of the present disclosure relate to incorporating the plurality of objects into a technical data package database. A relationship between each of the plurality of objects may be identified based on an impact each of the objects has on each other object in the development of the product. The plurality of objects may be integrated based on the relationship between each of the object so that an update to at least one object propagates through to each other object integrated with the at least one object. The integrated technical data package may be generated to provide an updated snapshot of the development of the product.

18 Claims, 7 Drawing Sheets

(56) References Cited

U.S. PATENT DOCUMENTS

| | | | |
|---|---|---|---|
| 8,126,850 B2* | 2/2012 | Yue | G06F 17/30489 |
| | | | 707/600 |
| 8,306,645 B2 | 11/2012 | Giebels | |
| 8,340,807 B1 | 12/2012 | Rodrigue et al. | |
| 8,346,381 B2 | 1/2013 | Sohmshetty et al. | |
| 8,554,594 B2 | 10/2013 | Paull et al. | |
| 8,606,624 B2 | 12/2013 | Harsh et al. | |
| 8,706,450 B2 | 4/2014 | Stolper | |
| 8,738,410 B2 | 5/2014 | Cogswell et al. | |
| 8,793,218 B2 | 7/2014 | Herold et al. | |
| 9,021,458 B1* | 4/2015 | Jacob | G06F 8/65 |
| | | | 717/168 |
| 9,063,711 B2 | 6/2015 | Baek | |
| 9,081,919 B2 | 7/2015 | Dai et al. | |
| 2005/0256844 A1* | 11/2005 | Cristol | G06Q 10/00 |
| 2006/0174190 A1* | 8/2006 | Gomes | G06F 17/24 |
| | | | 715/229 |
| 2007/0192170 A1* | 8/2007 | Cristol | G06Q 10/00 |
| | | | 705/7.12 |
| 2008/0033700 A1* | 2/2008 | Kano | G06F 17/50 |
| | | | 703/1 |
| 2010/0228529 A1* | 9/2010 | Choudhury | G06F 8/10 |
| | | | 703/2 |
| 2012/0191507 A1* | 7/2012 | Bramworth | G06Q 10/06 |
| | | | 705/7.36 |
| 2015/0261525 A1* | 9/2015 | Kwon | G06F 8/71 |
| | | | 717/121 |
| 2016/0357408 A1* | 12/2016 | Zavar | G06Q 30/0603 |

\* cited by examiner

CREATING AND USING AN INTEGRATED TECHNICAL DATA PACKAGE

BACKGROUND

The design and manufacturing of complex products results in an immense amount of documentation generated by numerous different individuals involved in different phases of the design and manufacturing process. For example, several different departments and/or different entities each with multiple engineers may be engaged in different aspects in the design and manufacture of a single overall product. The coordination and integration of all the documentation generated and the efforts of so many individuals to ensure an efficient and high quality product is a daunting task.

Often times, platforms for structuring and/or organizing the documentation generated during the development of the product are not established during the planning stages of the development of the product so that any type of coordination of efforts during the development of the product is difficult to accomplish. Further, any change to and/or addition of a technical detail in any phase of the process regardless of the complexity of the change has a ripple effect on other aspects of development of the product. Unless this change is adequately accounted for and flowed down to the other aspects impacted by the change, other issues may result causing significant complication and increased cost in the design and manufacture of the product. Thus, the integration of documentation into a comprehensive integrated technical data package is instrumental to ensure an efficient and high quality production of the product.

BRIEF SUMMARY

Embodiments of the present disclosure relate to integrating a plurality of objects that are associated with a development of a product into an integrated technical data package so that any change to and/or addition of an object is propagated through to each other impacted object. In an embodiment, a method generates an integrated technical data package that incorporates a plurality of objects associated with a development of a product so that each object is integrated with the other objects based on a relationship between each of the objects. The plurality of objects may be incorporated into a technical data package database. The plurality of objects is specific to the development of the product. A relationship between each of the plurality of objects may be identified based on an impact each of the objects has on each other in the development of the product. The plurality of objects may be integrated based on the relationship between each of the objects so that an update to at least one object propagates through to each other object integrated with the at least one object. The integrated technical data package may be integrated to incorporate each update to each object so that each update is propagated through to each other integrated object to provide an updated snapshot of the development of the product.

In an embodiment, a system may be implemented to generate an integrated technical data package that incorporates a plurality of objects associated with a development of a product so that each object is integrated with the other objects based on a relationship between each of the objects. The system includes a processor and memory coupled with the processor. The memory includes instructions that when executed by the processor cause the processor to incorporate the plurality of objects into a technical data package database. The plurality of objects is specific to the development of the product. The processor is configured to identify a relationship between each of the plurality of objects based on an impact each of the objects has on each other in the development of the product. The processor is configured to integrate the plurality of objects based on the relationship between each of the objects so that an update to at least one object propagates through to each other object integrated with the at least one object. The processor is configured to generate the integrated technical data package to incorporate each update to each object so that each update is propagated through to each other integrated object to provide an updated snapshot of the development of the product.

Further embodiments, features, and advantages, as well as the structure and operation of the various embodiments, are described in detail below with reference to the accompanying drawings.

BRIEF DESCRIPTION OF THE DRAWINGS/FIGURES

Embodiments are described with reference to the accompanying drawings. In the drawings, like reference numbers may indicate identical or functionally similar elements.

Figure 6:
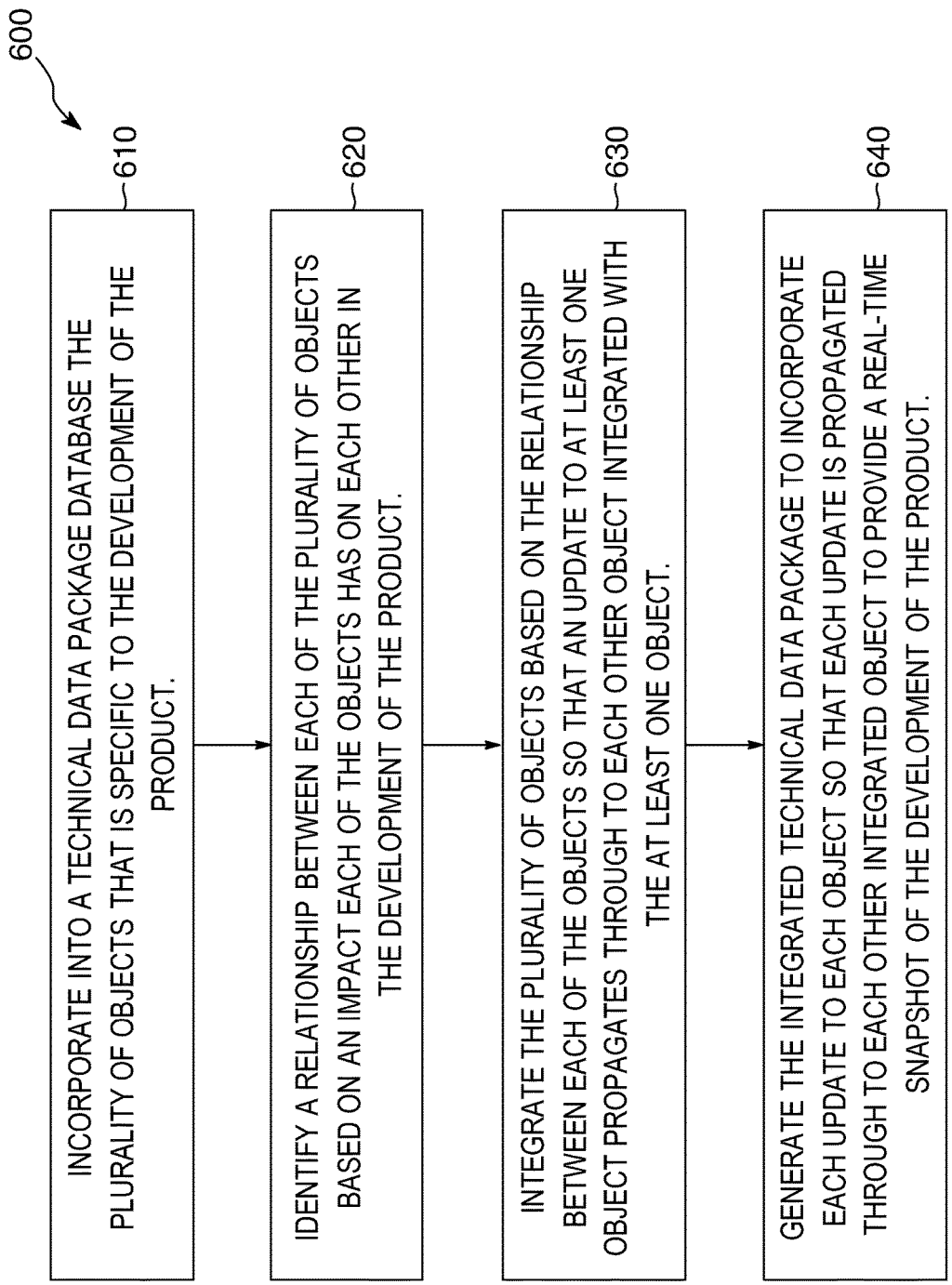
Figure 7:
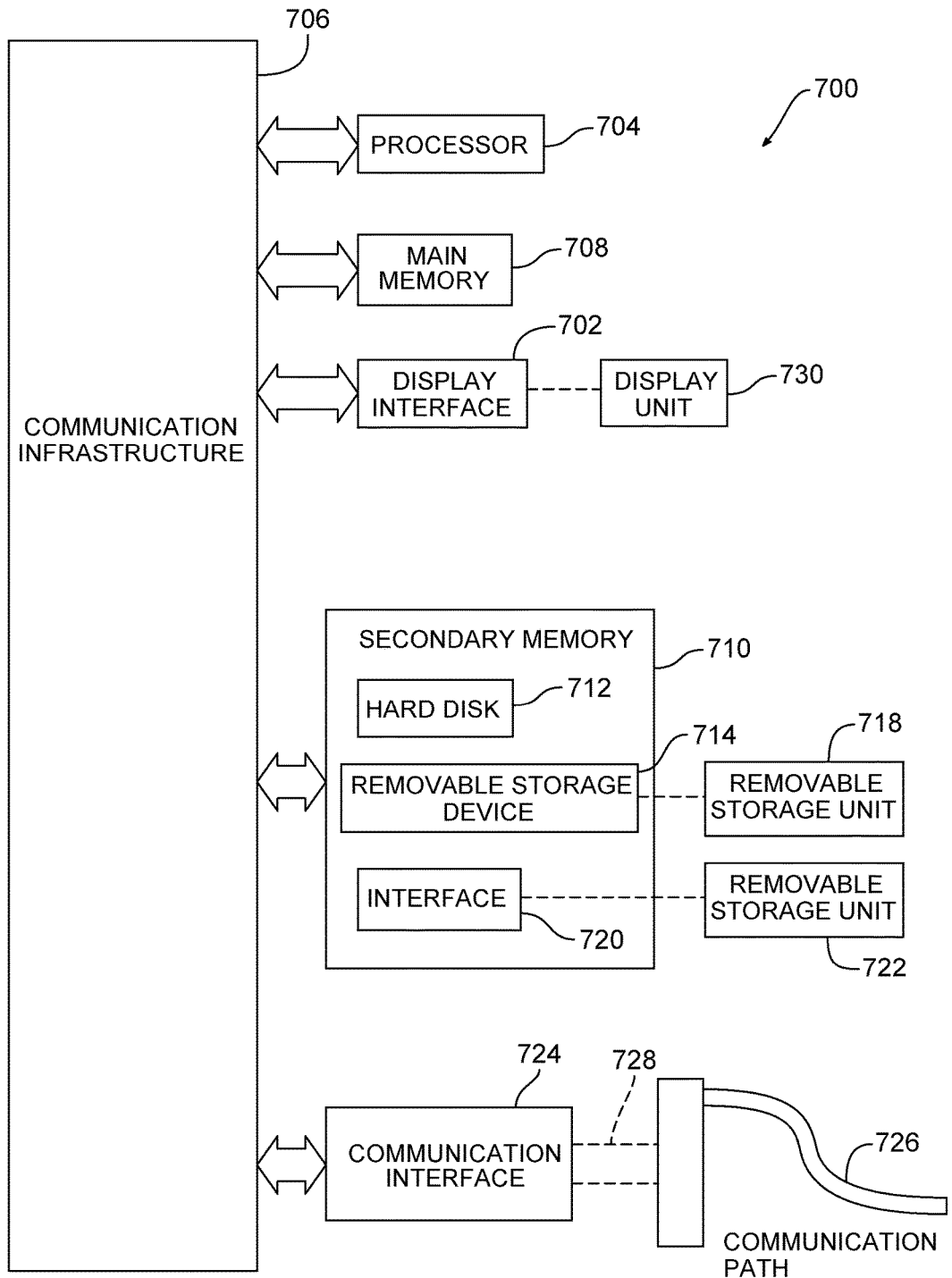

FIG. 6 is a flowchart showing an example method for generating an integrated technical data package that incorporates a plurality of objects associated with a development of a product so that each object is integrated with other objects based on a relationship between each of the objects; and FIG. 7 illustrates an example computer system in which embodiments of the present invention, or portions thereof, may be implemented as computer-readable code.

DETAILED DESCRIPTION

Embodiments of the disclosure generally relate to generating a technical data package associated with the development of a product. In an example embodiment, a plurality of objects associated with the development of a product is integrated into a technical data package. For example, the plurality of objects may include but are not limited to any material, feature, characteristic, tool, operation, and/or parameter that are generated in the development of the product. The quantity of objects generated in the development of a complicated product may be immense such that each object on its own may provide limited insight as to the development of the product. Rather, the coordination of the inter-relationship of the objects may provide significant insight as to the development of the product as well as the incorporation of changes to any of the objects such that any impact the change has to other objects is accounted for.

Thus, a relationship between each of the objects may be established based on an impact each of the objects has on each other in the development of the product. For example, a hole positioned on the product may be linked to other objects such as the size of the hole, the depth of the hole and so on. Any change to the hole itself may very well have an impact of the size of the hole or the depth of the hole. The relationship between an object and other objects may be based on an impact that the object has on the other objects in which a change to the object may trigger an impact on a significant quantity of other objects. As a result, neglecting to identify a relationship between objects may result in a failure to adequately ascertain the impact an object has on several other objects.

Objects that have a relationship with other objects may then be integrated based on those relationships so that an update to any of the objects propagates through to the other objects integrated with the changed object. Further, any update to any of the objects may also flow down to the operations and/or processes associated with the updated object such that the operations and/or processes account for the updated object in manufacturing the product. For example, an update to an angle of a bend for a part may then have an impact on the size and orientation of surrounding parts that may no longer fit properly after the angle of the bend has been adjusted as well as having an impact on the instruction manual in how the welder welds the part by updating how the welder positions the part in order for the part to bend at the updated angle. Thus, the integration of related objects ensures that any update to a single object is then propagated through and accounted for by the related objects integrated with the updated object.

The quantity of objects incorporated into the development of the product may be significant. Updates to the objects may be exponentially greater than the quantity of objects as well as the continuous addition of new objects may occur on a daily basis throughout the lifetime of a product. Thus, an integrated technical data package may be generated that incorporates each update to each changed object and propagates through those updates to other objects integrated with the changed objects as well as incorporating new objects and integrating those new objects with the existing objects. Such an integrated technical data package may provide an updated snapshot of the development of the product so that any individual regardless of the level of knowledge that the individual has for the development of the product may have an understanding of any facet of the development of the product.

In the Detailed Description herein, references to "one embodiment", "an embodiment", an "example embodiment", etc., indicate that the embodiment described may include a particular feature, structure, or characteristic, by every embodiment may not necessarily include the particular feature, structure, or characteristic. Moreover, such phrases are not necessarily referring to the same embodiment. Further, when a particular feature, structure, or characteristic may be described in connection with an embodiment, it may be submitted that it may be within the knowledge of one skilled in the art to affect such feature, structure, or characteristic in connection with other embodiments whether or not explicitly described.

The following detailed description refers to the accompanying drawings that illustrate exemplary embodiments. Other embodiments are possible, and modifications can be made to the embodiments within the spirit and scope of this description. Those skilled in the art with access to the teachings provided herein will recognize additional modifications, applications, and embodiments within the scope thereof and additional fields in which embodiments would be of significant utility. Therefore, the detailed description is not meant to limit the embodiments described below.

System Overview

Figure 1:
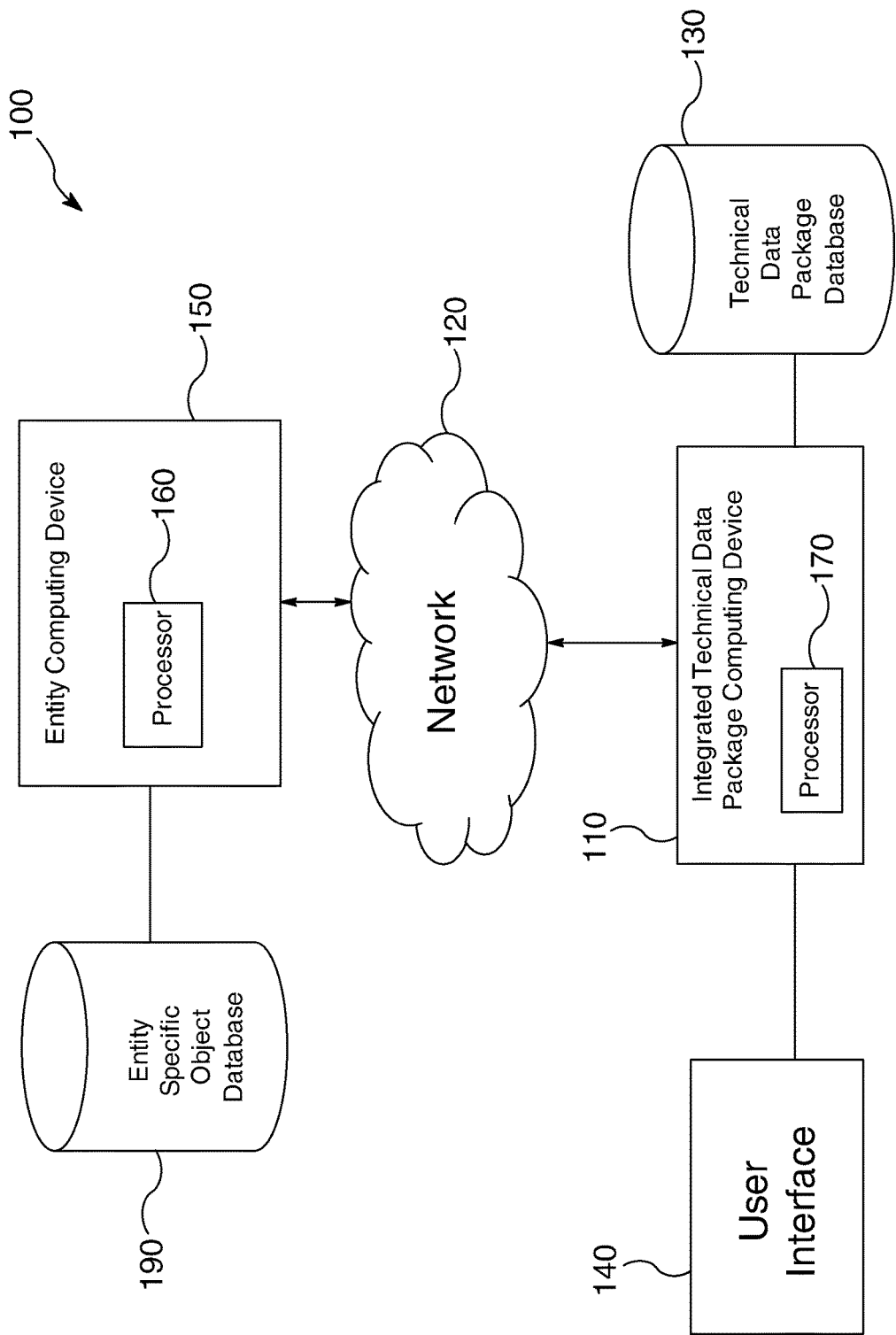
FIG. 1 shows an illustration of an integrated technical data package generating system.

As shown in FIG. 1, an integrated technical data package generating system 100 includes an integrated technical data package computing device 110, an integrated object database 130, a user interface 140, a network 120, an entity computing device 150 and an entity specific object database 190. Integrated technical data package computing device 110 includes a processor 170. Entity computing device 150 includes a processor 160.

Integrated technical data package computing device 110 may be a device that is capable of integrating a plurality of objects and generating an integrated technical data package that provides an updated snapshot of a development of a product. Examples of integrated technical data package computing device 110 may include a mobile telephone, a smartphone, a workstation, a portable computing device, other computing devices such as a laptop, or a desktop computer, cluster of computers, set-top box, a product inventory checking system and or any other suitable electronic device that will be apparent to those skilled in the relevant art(s) without departing from the spirit and scope of the invention.

In an embodiment, multiple modules may be implemented on the same computing device. Such a computing device may include software, firmware, hardware, or a combination thereof. Software may include one or more applications on an operating system. Hardware can include, but is not limited to, a processor, memory, and/or graphical user interface display.

Integrated technical data package computing device 110 may generate an integrated technical data package that integrates a plurality of objects associated with the development of the product to provide an updated snapshot of the development of the product. A product is something created by an entity that requires planning, design and/or manufacturing efforts to create and after completion is offered to a market to satisfy a want or need. For example, a product may include an infrared imaging system designed to operate on a military platform such as an aerial vehicle and/or tank in which the infrared imaging system is designed and/or manufactured to satisfy a significant amount of requirements and/or standards in order for the infrared imaging system to operate as required by the military entity. In another example, a product may include a software package that assists organizations in handling payment processing.

In either example, the development of the product requires extensive design efforts in which individuals such as program managers develop program plans for the development of the product and individuals such as engineers design the product so that when completed the product functions as marketed to customers. In other instances, the development of the product may also require extensive manufacturing efforts in which after the product has been designed, the product is then manufactured by individuals such as technicians to incorporate the design so that when completed the product functions as marketed to customers. Thus, the product may include any type of hardware, mechanical, software, and/or anything else that requires any level of planning, design and/or manufacturing efforts to create the product so that after completion the product is offered to a market to satisfy a want or need that will be apparent from those skilled in the relevant art(s) without departing from the spirit and scope of the present disclosure.

The development of the product includes any type of effort exerted whether regards to the planning, design, manufacturing, or any other aspect of the development of the product that advances the product to completion so that the product can be offered to a market to satisfy a want or need. The amount of effort exerted in the development of the product varies based on the complexity of the product. As the complexity of the development of the product increases, so does the amount of planning, the quantity of individuals, the amount of design efforts, the amount of documentation, the amount of information and/or data generated, the amount of changes made during the development and so on. Further, the quantity and complexity of requirements that the product is to satisfy also increases as the complexity of the development of the product increases. A requirement is a singular documented physical and/or functional need that a particular product is to satisfy when completed and offered to market. For example, an infrared imaging system may be required to continue to operate when experiencing a specified level of vibration.

Typically, the development of complex products incorporate a significant amount of individuals that are engaged in different departments of a single entity and/or different entities with each individual generating documentation, information, data, changes and so on to the development of the product so that the product satisfies each of the numerous requirements. The coordination of the individuals, documentation, information, data, changes and so on may be a daunting task due to the significant quantity of each involved in the development of the product. However, such coordination is necessary to ensure that not only does a single product satisfy each of the numerous requirements a single time but that each product that is produced and/or manufactured satisfies the necessary requirements so that the product functions as required after being offered to market.

For example, a change to a component on a circuit board to satisfy a maximum voltage requirement in that a specific voltage of the circuit board is not to exceed a maximum voltage limit may be made by an electrical engineer tasked with designing the circuit board. However, the change to the component may not be adequately tracked and/or communicated to the mechanical engineer tasked with designing a robotic arm that is required to operate in a minimum temperature environment. The amount of force required to move the robotic arm under cold temperatures may require significantly more current. However, the change in the component to limit voltage on the circuit board prohibits the amount of current required to move the robotic arm under cold temperatures. Thus, significant time and resources may be committed in an attempt to determine the cause of the robotic arm failing the cold temperature requirement due to the failure to track and coordinate the change to the component on the circuit board so that the change is rippled down to the robotic arm resulting in a significant increase in cost to develop the product.

Integrated technical data package computing device 110 may track and/or coordinate the documentation, information, data, changes and so on generated during the development of the product and incorporate the generated documentation, information, data into an integrated technical data package. The integrated technical data package generated by integrated technical data package computing device 110 may enable a user to interact with the integrated technical data package to navigate in efficient manner through the documentation, information, data and so on that has been generated in the development of the product so that the user may generate an accurate assessment as to any aspect of the development of the product.

Rather than requiring a user to track down the documentation, information, data and so on that has been generated up to a specific time to assess a specific aspect of the development of the product, integrated technical data package computing device 110 incorporates each object that has been generated thus far in the development of the product into the integrated technical data package. An object is any type of data and/or documentation that has been generated during the development of the product. Integrated technical data package computing device 110 may then incorporate each object associated with the development of the product into the integrated technical data package with an interactive platform so that any change to and/or addition of an object is propagated through to each other impacted object so that the user may then efficiently navigate through each object via user interface 140 to assess any aspect of the development of the product. The integrated technical data package is the incorporation of each object generated during the development of the product into a user friendly environment so that the user may easily navigate through the integrated technical data package to analyze objects of interest.

For example, a door on a military vehicle may have several hinges that have to satisfy several military requirements such as withstanding a maximum force applied to the door while still enabling the door to open to allow the operators to vacate the vehicle. The plurality of objects generated during the development of the military vehicle from the development of the engine to the development of the body of the vehicle to development of the doors of the vehicle to the development of the hinges is extensive. However, integrated technical data package computing device 110 may incorporate objects generated during the development of the military vehicle into the integrated technical data package so that the objects associated with the hinge are easily filtered from the objects associated with the rest of the design of the military vehicle. As a result, an engineer involved with the design of the hinges of the door may easily navigate through each CAD drawing generated for the hinges during the development of the hinges. The engineer may then efficiently assess the current design status of the hinge and then proceed with generating additional changes to the current design of the hinge.

User interface 140 may include any type of display device including but not limited to a touch screen display, a cathode ray tube (CRT) monitor, a liquid crystal display (LCD) screen, and/or any other type of display device that includes a display that will be apparent from those skilled in the relevant art(s) without departing from the spirit and scope of the present disclosure.

The plurality of objects generated during the development of the product may be numerous and extensive and may be generated during many different facets of the development of the product. For example, objects may be generated when an engineer prepares a bill of materials which is a listing of each item required to assemble the product in which each object generated may not only include each item but the quantity of items as well as the specification of each item and so on. In another example, objects may be generated when an engineer prepares a requirements matrix which is a listing of each requirement the product is to satisfy before the product can be offered to market in which each object generated may not only include the requirement itself but the portion of the product that is impacted by each requirement, each engineering team that is responsible for each requirement and so on. In another example, objects may be generated when an operations manual is generated that outlines how a technician is to assemble the product in which each object not only includes each assembly step but also other types of testing, characteristics that are to be measured and recorded, and so on.

Objects may be generated from a bill of materials, a requirements matrix, an operations manual, a bill of features, a bill of characteristics, a bill of processes, a bill of documents and/or any other type of bill generated during the development of the product that will be apparent from those skilled in the relevant art(s) without departing from the spirit and scope of the present disclosure. Objects may also include any document, feature, characteristic, operation, material, tool, parameter and/or any other type of document and/or data generated during the development of the product that will be apparent from those skilled in the relevant art(s) without departing from the spirit and scope of the present disclosure.

One or more integrated technical data package computing devices 110 may engage one or more entity computing devices 150. Examples of entity computing device 150 may include a mobile telephone, a smartphone, a workstation, a portable computing device, other computing devices such as a laptop, or a desktop computer, cluster of computers, set-top box, a product inventory checking system and or any other suitable electronic device that will be apparent to those skilled in the relevant art(s) without departing from the spirit and scope of the invention.

In an embodiment, multiple modules may be implemented on the same computing device. Such a computing device may include software, firmware, hardware, or a combination thereof. Software may include one or more applications on an operating system. Hardware can include, but is not limited to, a processor, memory, and/or graphical user interface display.

Entity computing device 150 may be a computing device associated with an entity that is contributing to the generation of the product. The entity may employ individuals as well as provide the necessary resources for the entity to contribute to the generation of the product. For example, the entity may provide resources such as materials, equipment, and so on as well as employing individuals in order to contribute to the generation of the product.

Entity computing device 150 may have access to an entity specific object database 190. Entity specific object database 190 may include each object generated by the entity in the development of the product. As the entity contributes to the development of the product, entity computing device 150 may store each object generated during that development in entity specific object database 190. For example, the entity computing device 150 may store each drawing, bill of materials, requirement matrix, specifications, operations, parameters, tools implemented, processes executed, and so on generated during the development of the product by the entity. Integrated technical data package computing device 110 may then incorporate a bill of materials, a requirements matrix, an operations manual, a bill of features, a bill of characteristics, a bill of processes, a bill of documents and so on generated during the development of the product by entity computing device 150 into an organized manner in the integrated technical data package.

Entity specific object database 190 may include customized entity specific objects generated by the entity as the entity develops the product such that the customized entity specific objects may be generated by the entity based on the learning experiences that the entity encountered during development of the product. For example, through significant experimentation, the entity discovered that a specific reflective material applied to the body of a military aircraft absorbed the remaining 10% of radar waves that could not be reflected from the military aircraft with the body design of the aircraft. Such entity specific objects such as the type of material, the amount of material to be applied, how the material is to be manufactured, the mixture of the material and so on as determined based on the learning experiences of the entity during development of the product is stored in entity specific object database 190. Thus, each entity specific object stored in entity specific object database 190 may include each object specific to how the entity itself determined how to develop the product.

As shown, entity computing device 150 streams entity specific objects stored in entity specific object database 190 to integrated technical data package computing device 110 via network 120. Network 120 includes one or more networks, such as the Internet. In some embodiments of the present invention, network 120 may include one or more wide area networks (WAN) or local area networks (LAN). Network 120 may utilize one or more network technologies such as Ethernet, Fast Ethernet, Gigabit Ethernet, virtual private network (VPN), remote VPN access, a variant of IEEE 802.11 standard such as Wi-Fi, and the like. Communication over network 120 takes place using one or more network communication protocols including reliable streaming protocols such as transmission control protocol (TCP). These examples are illustrative and not intended to limit the present invention.

Entity computing device 150 may provide each entity specific object stored in entity specific object database 190 to integrated technical data package computing device 110 via network 120. The entity specific objects generated by the entity in the development of the product may provide significant insight to the user assessing different aspects of the development of the product so that the user does not have to duplicate work already completed by the entity in further developing the product but may rather build off the entity specific objects already generated by the entity. Thus, integrated technical data package computing device 110 may receive each entity specific object from entity computing device 150 and incorporate the entity specific objects into the integrated technical data package.

In an embodiment, each entity specific object stored in entity specific object database 190 may have a Uniform Resource Locator (URL) associated with each. Integrated technical data package computing device 110 may point to each URL associated with each corresponding entity specific object and access each entity specific object via the URL as streamed via network 120. For example, integrated technical data package computing device 110 may point to each part included on each bill of materials stored in entity specific object database 190 as well as each material included on each bill of materials and each part number associated with each part and material. Integrated technical data package computing device 110 may retrieve the entity specific objects stored in entity specific object database 190 in any manner that will be apparent from those skilled in the relevant art(s) without departing from the spirit and scope of the present disclosure.

Integrated technical data package computing device 110 may store each of the entity specific objects in technical data package database 130. Integrated technical data package computing device 110 may also store a plurality of standard objects in technical data package database 130. The standard objects stored in technical data package database 130 may be pre-defined for the development of the product. The standard objects may be a baseline of objects that are standard for a product in that the typical product likely includes the baseline of objects. For example, the product is a hinge. Standard objects stored in technical data package database 130 include requirements for holes, screws to insert through the holes to fasten the hinge to a door, the diameter of the holes, the depth of the holes, the angle of the holes, the length of the screws, the type of screws, the material to construct the hinge from, the angle in which the hinge is to be bent and so on. Each of these objects is typically required in developing a hinge.

Integrated technical data package computing device 110 generates the standard objects and stores the standard objects in technical data package database 130 so that integrated technical data package computing device 110 may incorporate the standard objects into the integrated technical data package when entity specific objects have not been provided by entity computing device 150. Rather than have gaps in the integrated technical data package when entity computing device 150 has not generated certain entity specific objects, integrated technical data package computing device 110 may fill the gaps of missing objects with standard objects so that the integrated technical data package may be complete.

Missing objects may trigger individuals associated with the development of the product to overlook the objects and thus have gaps in the development of the product. For example, the entity computing device 150 may fail to generate objects associated with the holes of the hinge that is to be fastened to military vehicle. The engineers associated with the design of the military vehicle may then overlook the hinges for the doors require holes. At the assembly phase of the military vehicle, the hinges provided for assembly of the military vehicle may not have holes and cannot be attached to the doors of the military vehicle so that the doors cannot be attached to the vehicle and so on resulting in significant delay in assembling the military vehicle.

A technician in an attempt to push the assembly forward may then drill holes on his own into the hinges so that the hinges may be attached to the doors and the assembly of the military vehicle may be completed. However, the technician when drilling the holes failed to take into account the vibration requirements that the military vehicle is to satisfy and drills holes with the incorrect diameter, depth, and angle. Although the technician was able to complete the assembly of the military vehicle by drilling holes into the hinges, the doors fell off the military vehicle when in combat because the holes drilled into the hinges were unable to account for the vibration that the military vehicle encountered when in use.

Thus, integrated technical data package computing device 110 may fill any gaps in the entity specific objects with standard objects stored in technical data package database 130. With regards to the example above, rather than failing to provide objects associated with the hinges when the entity specific objects generated by entity computing device 150 were insufficient, integrated technical data package computing device 110 may identify that the lack of entity specific objects associated with the hinge. Integrated technical data package computing device 110 may then determine the objects typically associated with the hinge and incorporate those standard objects stored in technical data package database 130 such as the holes, the diameter of the holes, depth of the holes, the angle of the holes and the location of the holes into the integrated technical data package for the hinge.

Even though the engineers associated with the design of the hole may not incorporate the actual diameter, depth, angle, and location of the holes into the design of the hinge, the incorporation of those standard objects into the integrated technical data package identifies those objects so those objects are not overlooked by the engineers in the design of the hinge. As a result, the engineers may then customize the standard objects of the diameter, depth, angle, and location of the holes to be specific to the design of the hinge for the military vehicle. After the engineers have customized the standard objects, the standard objects then become entity specific objects as being specific to the development of the hinges for the military vehicle. Thus, the user may customize the standard objects provided by integrated technical data package computing device 110 to be specific to the development of the product.

Integrated technical data computing device 110 may integrate each of the objects, including the standard objects and the entity specific objects, stored in technical data package database 130 with each other based on a relationship between each of the objects. As noted above, an extensive amount of objects may be generated during the development of the product as well as a significant amount of changes made to the objects. Each object may be related with many other objects in that the related objects have an impact on each other.

For example, a cryogenic cooler implemented in an infrared imaging system to cool the silicon substrate to a significantly low temperature to exercise the infrared detection characteristics of the silicon substrate is related to many different other objects associated with the infrared imaging system. The cryogenic cooler is related to the silicon substrate in that the cryogenic cooler cools the substrate to exercise the infrared detection characteristics of the silicon substrate. The cryogenic cooler is related to the performance of the infrared imaging system in that the performance depends on the ability of the cryogenic cooler to maintain the silicon substrate at the significantly low temperatures. The cryogenic cooler is related to the other electronics in the infrared imaging system in that the cryogenic cooler occupies a portion of the power budget allotted for the infrared imaging system so that the electronics are required to function on the remaining power budget and so on.

Any change to an object may then have an impact on each of the other objects that are related to the changed object. For example, a bend in a mechanical part may be adjusted so that the product may better handle vibration such that the product is able to satisfy the vibration requirement. However, the bend in the mechanical part may cause the mechanical part to no longer fit in the product with regards to other mechanical parts. Thus, the other mechanical parts may have to be re-sized as well in order to fit with the mechanical part with the changed bend while still having the product satisfy the vibration requirement.

As noted above, products requiring complex development may have an extensive amount of changes occurring to a significant amount of objects by several different individuals on a daily basis. Any failure to propagate any of the changes in the objects down to the other objects impacted by the changes may have significant negative impacts on the development in the product such as significantly increasing the cost in the development of the product while having a significant impact on the quality of the product. To account for any change to the objects, integrated technical data package computing device 110 may identify the relationship between each of the objects stored in technical data package database 130 by determining the impact that each object has on each other object. Integrated technical data package computing device 110 may then integrate each of the objects with each of the other related objects.

The integration of each of the objects stored in technical data package database 130 with each of the corresponding related objects enables integrated technical data package computing device 110 to account for any change to any object. Integrated technical data package computing device 110 may propagate a change to an object through to each related object based on the integration of the related objects. For example, an engineer changes the bend to a mechanical part in the product to satisfy the vibration requirement of the product. Integrated technical data package database 110 may then propagate the change in the bend to the mechanical part to each of the other mechanical parts integrated with the mechanical parts. Such a propagation may then make the engineer aware and/or other engineers aware that the change in the bend to the mechanical part has an impact on other integrated mechanical parts in that the other mechanical parts may no longer fit properly in the product due to the change in the bend of the mechanical part. Due to the propagation of the change in the bend of the mechanical part to the other mechanical parts, the appropriate engineer may then address the design of the other mechanical parts so that the other mechanical parts fit properly within the product while still satisfying the vibration requirement of the product.

Often times, a significant amount of changes to objects occur when the product is being manufactured. The integration of related objects by integrated technical data package computing device 110 enables integrated technical data package computing device 110 to account for changes to objects during the manufacturing phase of the product. For example, the engineer changes the bend in the mechanical part after the product has been assembled and is undergoing vibration testing. The engineer was unable to foresee the need to change the bend in the mechanical part until the product has been assembled and failed vibration testing. Numerous other mechanical parts may already be in the process of being manufactured with the previous bend. Integrated technical data package computing device 110 may propagate the change in the bend to the mechanical parts already manufactured, being manufactured, and to be manufactured such that the bend is accounted for in the manufacturing of the mechanical parts rather than having the engineer identify the incorrect bend in the mechanical parts after being delivered for assembly into the products.

The integration of related objects by integrated technical data package computing device 110 and the propagation of changes to objects to the corresponding related objects enables integrated technical data package computing device 110 to generate an integrated technical data package that provides an updated snapshot of the development of the product. An updated snapshot of the development of the product includes each object generated during the development of the product as well as each change to each object as well as each change propagated through to each corresponding related object at the point in time when the user views the integrated technical data package via user interface 140. Such an updated snapshot enables the user to confidently rely upon the state of the objects included in the integrated technical data package as being accurate and up to date so that the user may then add additional objects and/or make changes to objects to further the development of the product in an efficient manner.

For example, an engineer may engage the integrated technical data package and observe that the product had previously failed the vibration requirement as well as the change in the bend in the mechanical part. Rather than attempting to independently identify additional solutions to have the product pass the vibration requirement, the engineer views the updated snapshot of the development of the product and recognizes that the change in the bend in the mechanical part has the product currently passing the vibration requirement. The engineer may then initiate design of additional aspects of the product while taking into account the change in the bend in the mechanical part as well as changes to other mechanical parts impacted by change in the bend in the mechanical part.

In an embodiment, integrated technical data package computing device 110 may extract the objects from documents stored in technical data package database 130. As noted above, an object may be any type of data associated with the development of the product. As a result, a document itself may have several different objects incorporated in the document. Integrated technical data package computing device 110 may then extract those different objects from the document and incorporate the objects into the integrated technical data package.

Figure 2:
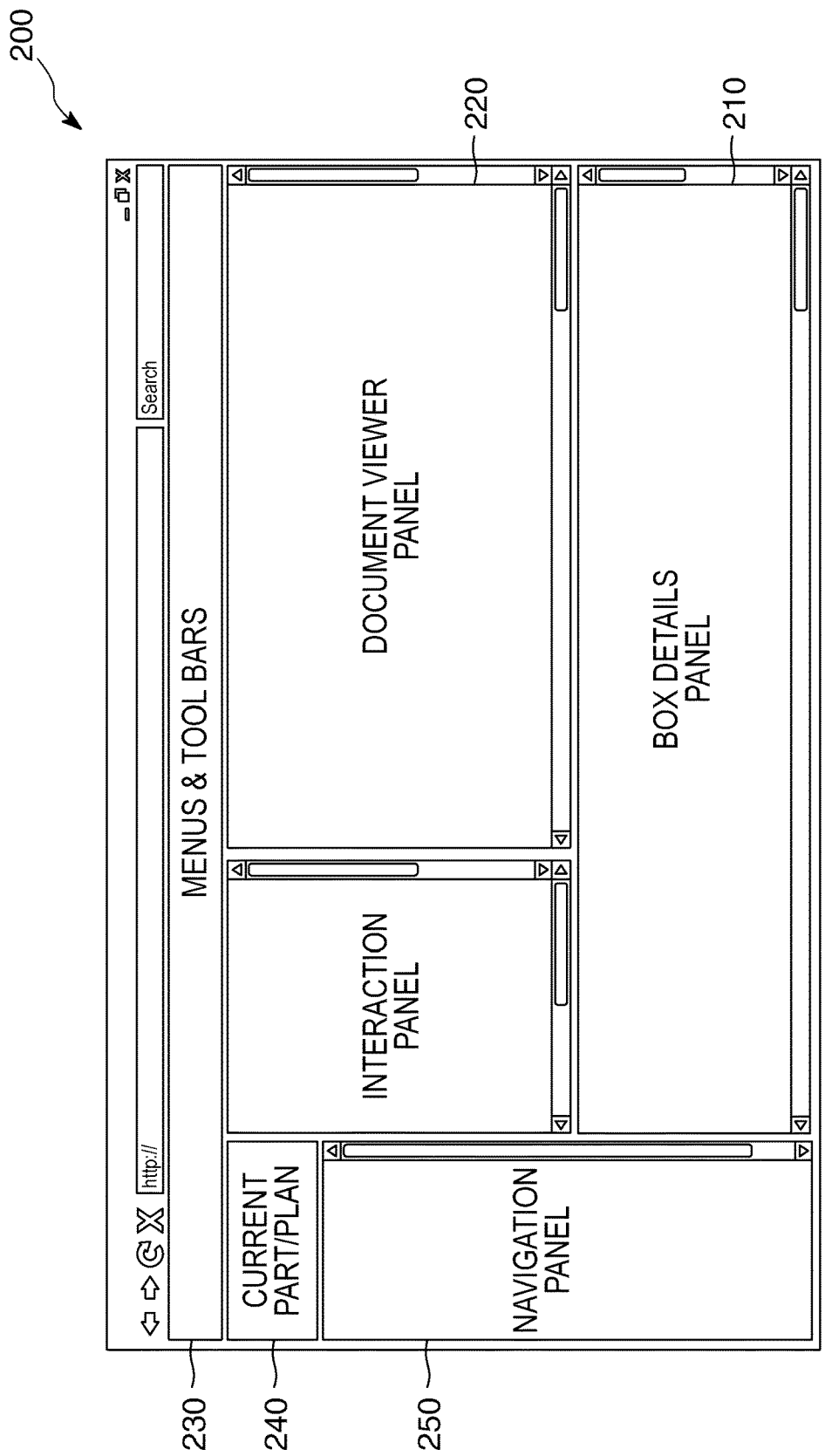
FIG. 2 depicts an example user interface display that displays an example integrated technical data package.

For example, FIG. 2 depicts a user interface display 200 of an integrated technical data package that incorporates objects extracted from documents by integrated technical data package computing device 110 and displayed via user interface 140. Current Part/Plan 240 identifies the current part and/or plan that the user requests to examine in detail with regards to the objects associated with that current part and/or plan. As noted above, integrated technical data package computing device 110 may incorporate a significant amount of objects associated with numerous different aspects of the development of the product into the integrated technical data package. Current Part/Plan 240 enables the user to filter the objects that the user requests to analyze based on a single part and/or plan. Integrated technical data package computing device 110 then filters the objects to be displayed via user interface 140 to the user so that only the objects associated with the selected Current Part/Plan 240 are displayed. A navigation panel 250 provides a listing of the different types of objects associated with Current Part/Plan 240.

For example, navigation panel 250 lists the different types of objects associated with Current Part/Plan 240 such as the materials, documents, processes, operations, views, and tooling associated with Current Part/Plan 240. The user may then select the type of objects associated with Current Part/Plan 240 to view in more detail such as the documents associated with Current Part/Plan 240. Interaction panel 230 then lists the different libraries associated with Current Part/Plan 240 in which interaction panel 230 provides a listing of the different types of objects associated with Current Part/Plan 240. BoX Details Panel 210 then lists the different documents associated with Current Part/Plan 240 as provided by the different bills of objects, such as bill of materials, bill of characteristics, bill of features and so on. The user may then select a specific document and view the document in a document view panel 220. For example, document view panel 220 displays a drawing associated with Current Part/Plan 240. Integrated technical data package computing device 110 may also extract the objects associated with the different types of bills associated with Current Part/Plan 240 and list the different types of bills in BoX Details Panel 210. For example, integrated technical data package computing device 110 may extract the objects from the bill of materials, bill of documents, bill of features, bill of characteristics, bill of processes, bill of operations, bill of tooling, and bill of views associated with Current Part/Plan 240.

Example Integration Configuration

Figure 3:
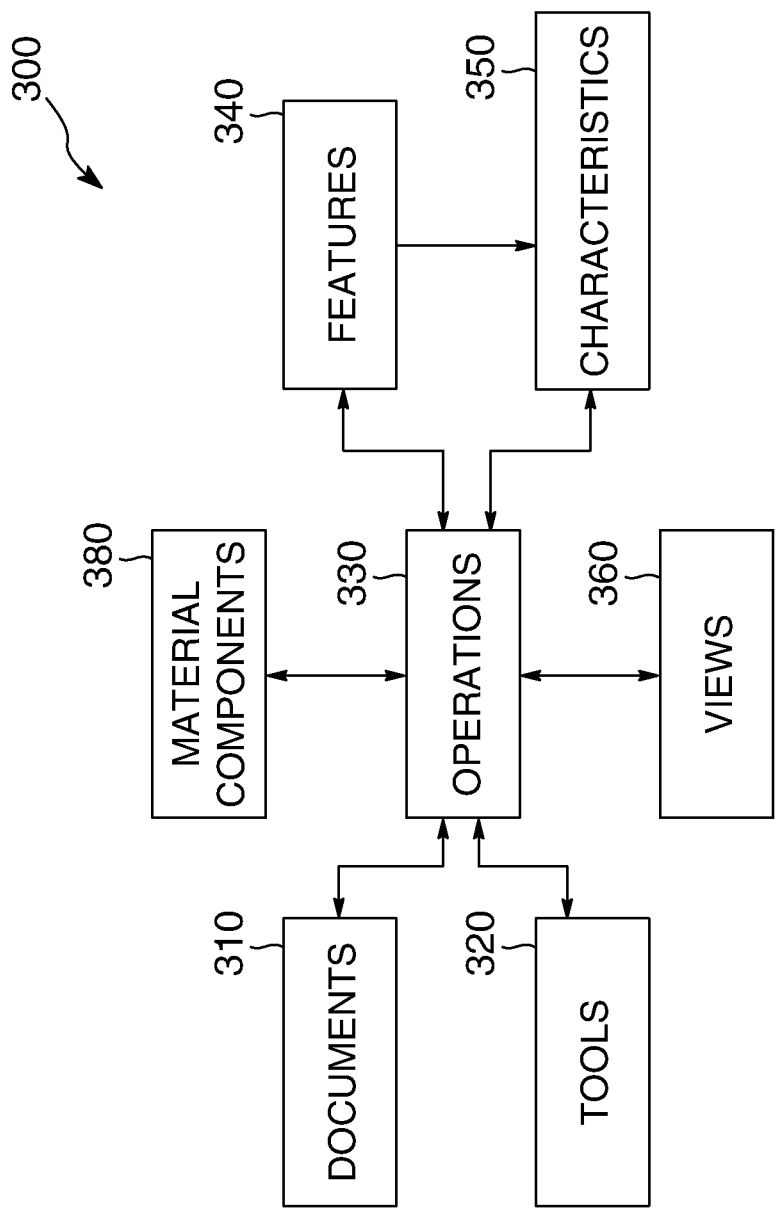
FIG. 3 depicts an example integration configuration generated by integrated technical data package computing device when integrating each object with each other corresponding related object.

FIG. 3 depicts an example integration configuration 300 generated by integrated technical data package computing device 110 when integrating each object with each other corresponding related object. As noted above, integrated technical data package computing device 110 may identify a relationship between each object based on an impact that each object has on each other corresponding object and then integrate the related objects. FIG. 3 depicts an example integration configuration generated by integrated technical data package computing device 110 but is not limiting. Any other type of integration configuration may be generated by integrated technical data package computing device 110 in order to adequately integrate related objects that have an impact on each other to generate an integrated technical data package that provides an updated snapshot of the development of the product that will be apparent from those skilled in the relevant art(s) without departing from the spirit and scope of the present disclosure.

With regards to example integration configuration 300 generated by integrated technical data package computing device 110, integrated technical data package computing device 110 may identify objects that are associated with a material component 380. A material component 380 may be an individual component that is required to develop the product. For example, a material component 380 may be a hinge that is required to attach a door to a military vehicle.

Integrated technical data package computing device 110 may also identify objects associated with features 340. A feature 340 may be a specific aspect associated with the development of the product. For example, the feature 340 may be but is not limited to specific aspects associated with a material component 380. In such an example, the material component 380 may be the hinge of the military vehicle while the features 340 may include the holes of the hinge, the bend of the hinge, and the welds of the hinge.

Integrated technical data package computing device 110 may identify the relationship between objects associated with the material components 380 included in the development of the product with the objects associated with the features 340 of each of the material components 380. In doing so, integrated technical data package computing device 110 may identify that a change to the objects associated with the material components 380 may also have an impact on the objects associated with the features 340 of the changed material components 380. For example, any change to the hinge is likely to have an impact on the features 340 of the hinge that include the holes of the hinge, the bend of the hinge, and the welds of the hinge. Thus, integrated technical data package computing device 110 integrates the objects associated with the hinge with the objects associated with the features 340 of the hinge. The integration of different material components 380 enables integrated technical data package computing device 110 to propagate any change to a material component 380 to other features 340 integrated with the changed material component 380.

Integrated technical data package computing device 110 may also identify objects associated with characteristics 350. A characteristic 350 may be an aspect of a feature 340 that describes the feature 340 in which a feature 340 may have one or more characteristics 350 describing the feature 340. For example, the feature 340 may include the holes of the hinge while the characteristics 350 of the hole may be aspect ratio of the hole, the depth of the hole, the diameter of the hole, and the angle of the hole.

Integrated technical data package computing device 110 may identify the relationship between objects associated with the feature 340 of the material components 380 with the objects associated with the characteristics 350 of each of the features 340. In doing so, integrated technical data package computing device 110 may identify that a change to objects associated with the features 340 may also have an impact on the objects associated with the characteristics 350 of the changed feature 350. For example, any change to the holes of the hinge is likely to have an impact on the characteristics 350 of the holes of the hinge that include the aspect ratio of the holes, the depth of the holes, the diameter of the holes, and the angle of the holes. Thus, integrated technical data package computing device 110 integrates the objects associated with the holes of the hinge with the objects associated with the characteristics 350 of the holes of the hinge. The integration of different features 340 and related characteristics 350 enables integrated technical data package computing device 110 to propagate any change to a feature 340 to other characteristics 350 integrated with the changed feature 340.

Integrated technical data package computing device 110 may also identify the relationship between objects associated with different features 340 of the material components 380. In doing so, integrated technical data package computing device 110 may identify a change to the objects associated with a feature 340 may also have an impact on the objects associated with other features 340. For example, a change to the holes of the hinge may have an impact on the bend of the hinge as well as the weld of the hinge. The integration of different features 340 enables integrated technical data package computing device 110 to propagate any change to a feature 340 to other features 340 integrated with the changed feature 340.

Integrated technical data package computing device 110 may also associate each object incorporated into the integrated technical data package with a corresponding operation 330. An operation 330 is an object that defines how a corresponding object is to be implemented in the development of the product. Examples of operations 330 may include but are not limited to instructions and/or processes on how to create a material component 380, feature 340, and/or characteristics 350, instructions and/or processes in how to implement testing as specified in procedural documents 310 to ensure requirements are satisfied, instructions and/or processes defining the types of tools 320 that are to be implemented in creating the material component 380, feature, 340, and/or characteristic 350 as well as the types of tools 320 required to execute testing specific in procedural documents 310 and/or any other type of object that defines how a corresponding object is to be implemented in the development of the product that will be apparent to those skilled in the relevant art(s) without departing from the spirit and scope of the present disclosure.

Once an object associated with a material component 380, feature 340, characteristic 350, procedural documents 310, tools 320, views 360 and so on is generated then it is likely that the object is to be implemented into the development of the product otherwise there would be no reason to create the object. A procedural document 310 may identify the specifications, requirements, and/or instructions associated with other objects such as material components 380, features 340, characteristics 350 and so on. For example, a procedural document 310 may instruct that amperage of a circuit board is to be measured while testing the circuit board after the circuit board is assembled and that the amperage is to be within a specified threshold for the circuit board to pass the power requirement. Tools 320 may be the types of devices identified that are to be implemented in the development of the product. For example, the procedural document 310 may instruct that a specific device be used to measure the amperage of the circuit board as well as instructions as how to operate the device when measuring the amperage of the circuit board. Views 360 may be the views of objects that integrated technical data package computing device 110 has incorporated into the integrated technical data package. For example, views 360 may be the different CAD drawings associated with an object.

A failure to associate each object incorporated into the integrated technical data package with a corresponding operation 330 significantly increases the risk that the implementation of the object into the development of the product may be overlooked and/or implemented incorrectly. For example, a feature 340 of the hinge is the weld of the hinge and a procedural document 310 provides the temperature specification that the hinge is required to satisfy. The weld of the hinge as well as the high temperature requirement of the hinge is not associated with a corresponding operation 330. Thus, no instructions exist instructing the welder as to the type of weld to use when welding the hinge. The welder understands a weld is to be applied to the hinge but is unaware of the high temperature requirement that the weld is to satisfy. The welder then selects a weld that is relatively inexpensive and easily obtained but weakens under the high temperature requirement and the doors that the hinge attaches to the military vehicle fall off in combat when exposed to a high temperature environment.

Rather, integrated technical data package computing device 110 ensures the weld of the hinge as well as the high temperature requirement is associated with a corresponding operation 330. Integrated technical data package computing device 110 ensures that operations 330 instruct the welder as to the type of weld to use as well as the angle in which to hold the hinge when generating the weld as well as the jig tool the welder should use when making the weld. The association of the weld of the hinge and the high temperature requirement with a corresponding operation 330 by integrated technical data computing device 110 ensures that the weld is implemented by the welder correctly to satisfy other objects such as requirements, specifications and so on. Integrated technical data package computing device 110 may alert the user as to any object that is not associated with a corresponding operation 330 so that the user may then generate objects associated with operations 330 for those objects and thus ensuring that the user does not overlook the missing operations.

Further, integrated technical data package computing device 110 may propagate any change to an object to the corresponding operations 330 associated with the changed object. The propagation of the change of the object to the corresponding operations 330 may ensure that that the object is implemented correctly when developing the product and thus providing an updated snapshot of the development of the product. As noted above, numerous changes to objects may occur after the initial design of the product and when the product is initially being manufactured. Individuals associated with the development of the product may gain significant knowledge as to the design of the product after the product is initially assembled and is being tested. Thus, a change to the object but a failure to propagate that change to corresponding operations 330 may result in a failure to ultimately implement the change in the development of the product.

For example, an initial angle of a weld as designed by an engineer and is incorporated into the integrated technical data package as a feature 340 resulted in a failed vibration testing of the military vehicle because the weld broke under vibration and the hinge became detached from the military vehicle. The engineer then changed the angle of the weld to better account for the forces applied to the weld as experienced during the vibration testing resulting in the military vehicle satisfying the vibration requirement. Integrated technical data package computing device 110 then propagated the change of the angle of the weld to operations 330 that instruct the welder as to how to complete the weld.

In propagating the change of the angle of the weld to operations 330, the engineer noticed that the welder would have to change the angle in which the hinge is placed in the jig in order to complete the updated angle of the weld and the engineer updated the operations 330 associated with the weld accordingly. Integrated technical data package computing device 110 also propagated the updated weld instructions to the appropriate operations 330 and provided an updated snapshot of the current instructions as to how to complete the weld. The welder was then made aware as to how to place the hinge in the jig to complete the updated angle of the weld when the welder engaged the updated integrated technical data package for the weld instructions.

Identification of Previous Incorporation of Objects

Figure 4:
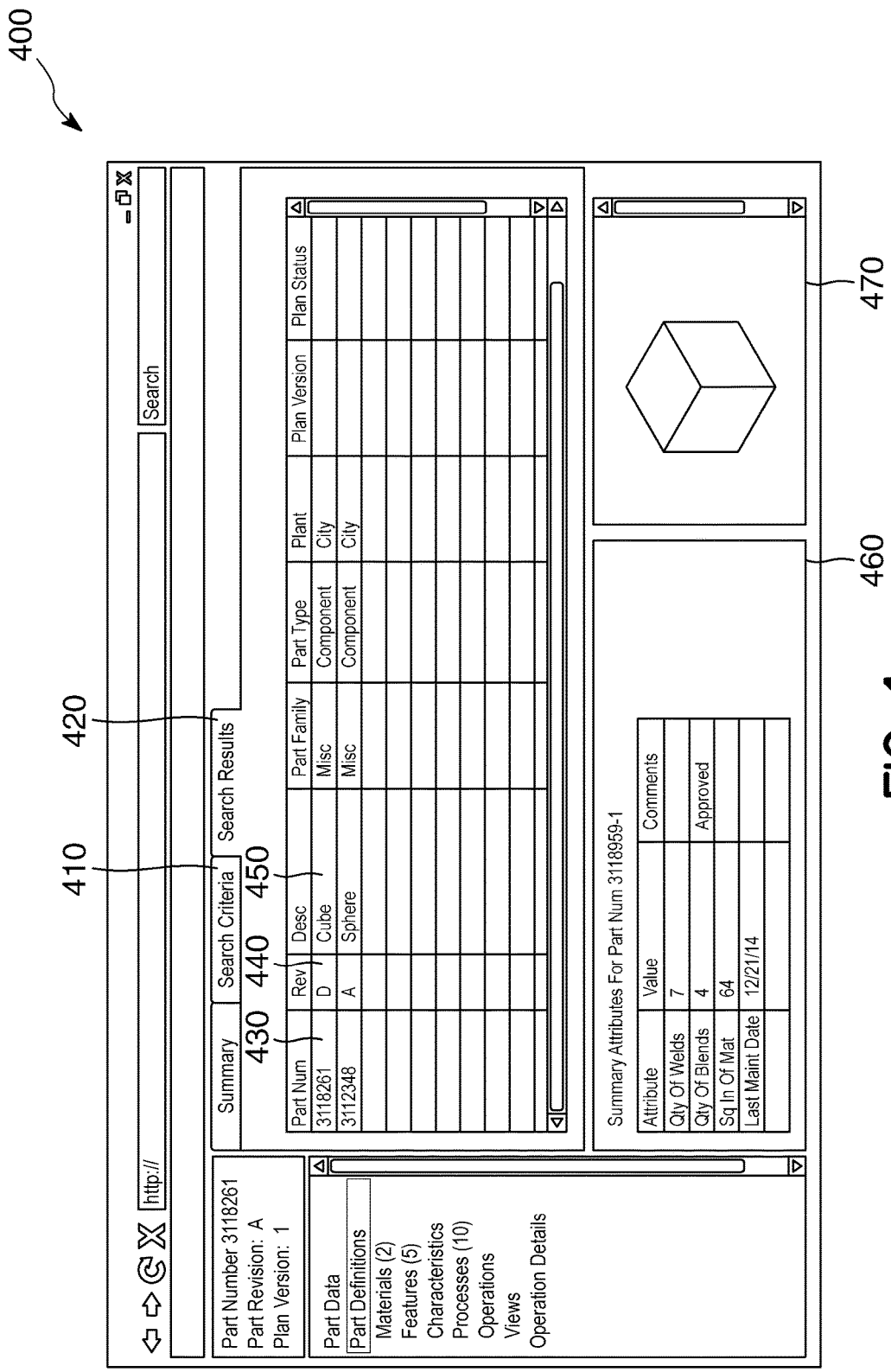
FIG. 4 depicts an example object identification configuration.

FIG. 4 depicts an example object identification configuration 400. As noted above, an entity may generate numerous objects while making numerous changes to the objects throughout the development of the product. The individuals associated with the development of the product may learn a significant amount of information throughout the development of the product such that additional changes to objects are made as well as the generation of new objects until the development of the product has reached a quality level in which the product sufficiently satisfies the numerous requirements and may be offered to market. Thus, the development of the product may be an extensive iterative process in which the entity expends extensive resources with regards to financing, manpower, materials and so on during the development.

Often times, an entity may engage in several different contracts with various other entities with each entity requiring a different type of product with a different set of requirements. However, often times particularly with complex products, there may be significant overlap in the types of objects that may be transferable between products and/or may require minor modification for the already completed objects to satisfy the different set of requirements for the different product. For example, an entity that manufactures military vehicles for a military entity may also enter a contract to manufacture all terrain vehicles for a park service located in the mountains. Military vehicles subject to stringent environmental requirements may have a significant overlap in objects that may also satisfy the environmental requirements for the all terrain vehicles.

Rather than initiating a completely new development of all terrain vehicles, the entity may take advantage of the significant resources devoted to the development of the military vehicle and incorporate objects generated in the development of the military vehicle into the development of the all terrain vehicles. Integrated technical data package computing device 110 may identify objects included in the development of the military vehicle that are similar to the objects and required in the development of the all terrain vehicle. In doing so, integrated technical data package computing device 110 may query technical data package database 130 for objects generated in the development of the military vehicle that satisfy search criteria entered by the user.

For example, object identification configuration 400 provides an example of objects identified by integrated technical data package computing device 110 that satisfy search criteria entered by the user as displayed by user interface 140. The user may enter search criteria into the search criteria tab 410. For example, the user may request that integrated technical data package computing device 110 identify drain plugs implemented in the development of the military vehicle that may also be implemented in the development of the all terrain vehicle. In doing so, the user may enter features and/or characteristics that are required of the drain plug for the all terrain vehicle into search criteria tab 410.

Integrated technical data package computing device 110 may then identify the objects that satisfy the search criteria for the drain plug as entered by the user via search results tab 420. In such an example, integrated technical data package computing device 110 identifies the part number 430 of the object that satisfies the search criteria entered by the user, the current revision 440 of the object, and the description 450 of the object. Integrated technical data package computing device 110 then generates a summary of attributes 460 of the object that satisfies the search criteria entered by the user as well as drawings 470 of the object. Integrated technical data package computing device 110 then identifies relationships of objects, integrates the related objects, and generates an integrated technical data package for the development of the second product which in this example is the all terrain vehicle as discussed in detail above.

Object Extraction from Drawings

Figure 5:
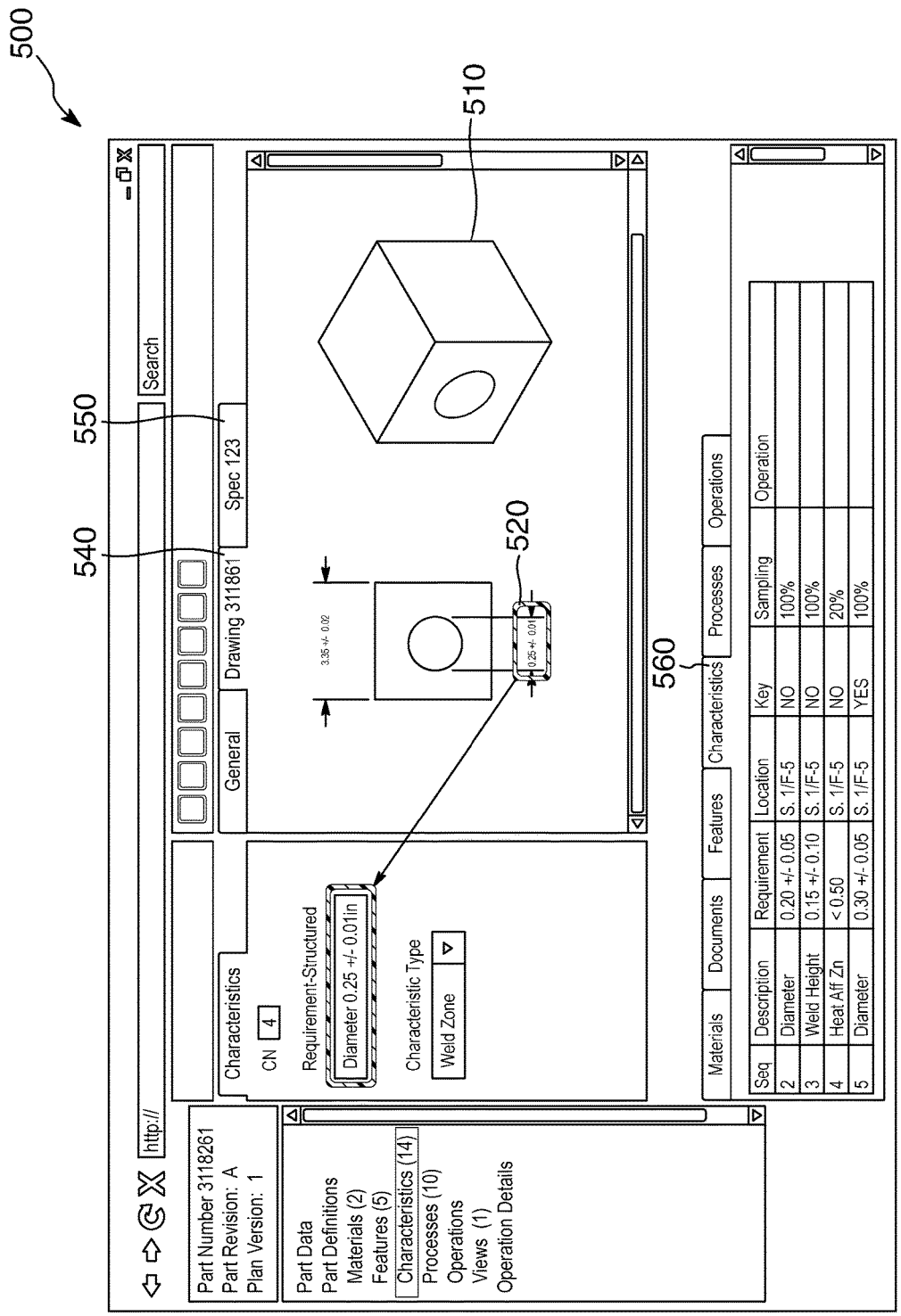
FIG. 5 depicts an example object drawing extraction configuration.

FIG. 5 depicts an example object drawing extraction configuration 500. As noted above, objects may include views, such as CAD drawings, that depict an image of respective objects such as material components. Views may also include different views within a single document. Views may also include different perspectives within a single document. Views may also include different modules/drawings within a single document. In addition to the depicting an image of the respective objects, views also provide a significant amount of additional objects that provide further insight as to the object depicted in the image. For example, not only does a CAD drawing depict an image of a material component, the CAD drawing also provides features and characteristics associated with the material component such as the diameter of holes of the material component, weld height and so on.

Integrated technical data package computing device 110 enables a user to identify an object included in a view and then extracts the selected object via optical character recognition (OCR) from the view. Integrated technical data package computing device 110 may then display the extracted object via user interface display 140. Integrated technical data package computing device 110 may also automatically identify the objects integrated with the selected object. For example, integrated technical data package computing device 110 may automatically identify the features and characteristics integrated with the selected object. Integrated technical data package computing device 110 may then display the objects integrated with the selected object via user interface 140 to provide the user with additional information associated with the selected object.

There may be instances when integrated technical data package computing device 110 is unable to identify values associated with the objects integrated with the selected object. For example, the user may select a hole from a CAD image. Integrated technical data package computing device 110 then identifies the integrated characteristics associated with the hole to be a diameter and depth of the hole. However, integrated technical data package computing device 110 is unable to identify values that have been incorporated into the integrated technical data package for the diameter and depth of the hole.

With regards to a three-dimensional CAD image, integrated technical data package computing device 110 may determine the unknown values associated with the objects integrated with the selected object from the three-dimensional CAD image itself. For example, integrated technical data package computing device 110 may determine the unknown values of the diameter and depth of the selected hole from the three-dimensional CAD image itself. With regards to a two-dimensional CAD image, integrated technical data package computing device 110 may notify the user that the values associated with the objects integrated with the selected object are unknown and request that the user provide those unknown values so that the values may be incorporated into the integrated technical data package. For example, integrated technical data package computing device 110 may notify the user via user interface 140 that the values of the diameter and depth of the selected hole are unknown and request that the user provide those values.

For example, example object drawing extraction configuration 500 depicts an example extraction of a view as depicted by user interface 140. In such an example, the user selects a view 540. In this case, the user selects view 540 which is Drawing #31118269 that is a three-dimensional CAD drawing depicting a material object of a handle attached to a mechanical piece. Integrated technical data package computing device 110 then displays Drawing #31118269 via user interface 140 and also identifies a corresponding document 550 which is a Specification #123 that provides the specifications for the material object depicted by Drawing #31118269.

The user then identifies a characteristic associated with a hole by drawing a rectangle via user interface 140 around the diameter dimensions 520 of the hole as displayed via user interface 140. Integrated technical data package computing device 110 then automatically identifies additional characteristics 560 integrated with the diameter dimensions 520 of the holes and user interface 140 displays additional characteristics 560. In this example, integrated technical data package computing device 110 identifies additional characteristics associated with the diameter dimensions of the holes that includes the diameter requirements, weld height, and heating requirement and thus providing additional information to the user with regards to the diameter dimensions of the holes.

Method

FIG. 6 is a flowchart showing an example method 600 for generating an integrated technical data package that incorporates a plurality of objects associated with a development of a product so that each object is integrated with other objects based on a relationship between each of the objects. As shown in FIG. 6, method 600 begins at stage 610 when the plurality of objects that is specific to the development of the product is incorporated into a technical data package database. For example, as shown in FIG. 1 and FIG. 3, an integrated technical data package computing device 110 incorporates a plurality of objects such as not limited to procedural documents 310, tools 320, operations 330, features 340, characteristics 350, views 360 and/or material components 380 as provided by entity computing device 150 into a technical data package database 130. Stage 610 can be performed by, for example, processor 170.

At stage 620, a relationship between each of the plurality of objects is identified based on an impact each of the objects has on each other in the development of the product is identified. For example, as shown in FIG. 1 and FIG. 3, integrated technical data package computing device 110 may identity the relationship between each of the plurality of objects such as but not limited to procedural documents 310, tools 320, operations 330, features 340, characteristics 350, views 360 and/or material components 380 based on an impact each of the objects has one each other in the development of the product. Stage 620 can be performed by, for example, processor 170.

At stage 630, the plurality of objects may be integrated based on the relationship between each of the objects so that an update to at least one object propagates through to each other object integrated with the at least one object. For example, as shown in FIG. 1 and FIG. 3, integrated technical data package computing device 110 may integrate the plurality of objects, such as but not limited to procedural documents 310, tools 320, operations 330, features 340, characteristics 350, views 360 and/or material components 380 based on the relationship between each of the objects so that an update to at least one object propagates through to each other related object. Thus, an update to a feature 340 may be propagated through to procedural documents 310, tools 320, characteristics 350, other features 340 and so on that are integrated with the updated feature 340. Stage 630 can be performed by, for example, processor 170.

At stage 640, the integrated technical data package may be generated to incorporate each update to each object so that each update is propagated through to each other integrated object to provide an updated snapshot of the development of the product. For example, as shown in FIG. 1, FIG. 2 and FIG. 3, integrated technical data package computing device 110 may generate the integrated technical data package, such as an example of a portion of an integrated technical data package displayed by example user interface 200, to incorporate each update to each object, such as but not limited to procedural documents 310, tools 320, operations 330, features 340, characteristics 350, views 360 and/or material components 380 so that each update is propagated through to each other integrated object to provide an updated snapshot of the development of the product. Thus, the example of a portion of an integrated technical data package displayed by example user interface 200 displays an updated snapshot of the development of the product based on the updated procedural documents 310, tools 320, operations, 330, features 340, characteristics 350, views 360, and/or material components 380 displayed by example user interface 200.

Embodiments can work with software, hardware, and/or operating system implementations other than those described herein. Any software, hardware, and operating system implementations suitable for performing the functions described herein can be used. Embodiments are applicable to both a client and to a server or a combination of both.

Example Computer System

FIG. 7 illustrates an example computer system 700 in which embodiments of the present invention, or portions thereof, may be implemented as computer-readable code. For example, integrated technical data package computing device 110 may be implemented on computer system 700 using hardware, software, firmware, tangible computer readable media having instructions stored thereon, or a combination thereof and may be implemented in one or more computer systems or other processing system.

If programmable logic is used, such logic may execute on a commercially available processing platform or a special purpose device. One of ordinary skill in the art may appreciate that embodiments of the disclosed subject matter can be practiced with various computer system configurations, including multi-core multiprocessor systems, minicomputers, mainframe computers, computers linked or clustered with distributed functions, as well as pervasive or miniature computers that may be embedded into virtually any device.

Various embodiments of the invention are described in terms of this example computer system 700. After reading this description, it will become apparent to a person skilled in the relevant art how to implement the invention using other computer systems and/or computer architectures. Although operations may be described as a sequential process, some of the operations may in fact be performed in parallel, concurrently, and/or in a distributed environment, and with program code stored locally or remotely for access by single or multi-processor machines. In addition, in some embodiments the order of operations may be rearranged without departing from the spirit of the disclosed subject matter.

As will be appreciated by persons skilled in the relevant art, a computing device having at least one processor, such as processor 704, where the processor may be a single processor, a plurality of processors, a processor in a multi-core/multiprocessor system, such system operating alone, or in a cluster of computing devices operating in a cluster or server farm. Processor 704 is connected to a communication infrastructure 706, for example, a bus, message queue, network, or multi-core message-passing scheme.

Computer system 700 also includes a main memory 708, for example, random access memory (RAM), and may also include a secondary memory 710. Secondary memory 710 may include, for example, a hard disk drive 712, removable storage drive 714. Removable storage drive 714 may include a floppy disk drive, a magnetic tape drive, an optical disk drive, a flash memory, or the like. The removable storage drive 714 reads and/or writes to a removable storage unit 718 in a well-known manner. Removable storage unit 718 may include a floppy disk, magnetic tape, optical disk, etc. which is read by and written to by removable storage drive 714. As will be appreciated by persons skilled in the relevant art, removable storage unit 718 includes a computer readable storage medium having stored therein computer software and/or data.

In alternative implementations, secondary memory 710 may include other similar devices for allowing computer programs or other instructions to be loaded into computer system 700. Such devices may include, for example, a removable storage unit 722 and an interface 720. Examples of such may include a program cartridge and cartridge interface (such as that found in video game devices), a removable memory chip (such as EPROM or PROM) and associated socket, and other removable storage units 722 and interfaces 720 which allow software and data to be transferred from the removable storage unit 722 to computer system 700.

Computer system 700 may also include a communications interface 724. Communications interface 724 allows software and data to be transferred between computer system 700 and external devices. Communications interfaces 724 may include a modem, a network interface (such as an Ethernet card), a communications port, a PCMCIA slot and card, or the like. Software and data transferred via communications interface 724 may be in the form of signals, which may be electronic, electromagnetic, optical, or other signals capable of being received by communications interface 724. These signals may be provided to communications interface 724 via a communications path 726.

In this document, the terms "computer program storage medium" and "computer usable storage medium" are used to generally refer to storage media such as removable storage unit 718, removable storage unit 722, and a hard disk installed in hard disk drive 712. Computer program storage medium and computer usable storage medium may also refer to memories, such as main memory 708 and secondary memory 710, which may be semiconductor memories (e.g., DRAMS, etc.).

Computer programs (also called computer control logic) are stored in main memory 708 and/or secondary memory 410. Computer programs may also be received via communications interface 724. Such computer programs, when executed, enable computer system 700 to implement embodiments as discussed herein. In particular, the computer programs, when executed, enable processor 704 to implement the processes of embodiments of the invention, such as the stages in the method illustrated by flowchart 600 of FIG. 6 discussed above. Accordingly, such computer programs represent controllers of the computer system 700. When an embodiment is implemented using software, the software may be stored in a computer program product and loaded into computer system 700 using removable storage drive 714, interface 720, and hard disk drive 712, or communications interface 724.

Embodiments can work with software, hardware, and/or operating system implementations other than those described herein. Any software, hardware, and operating system implementations suitable for performing the functions described herein can be used. Embodiments are applicable to both a client and to a server or a combination of both.

The breadth and scope of the present disclosure should not be limited by any of the above-described example embodiments, but should be defined only in accordance with the following claims and their equivalents.

CONCLUSION

The Brief Summary and Abstract sections may set forth one or more but not all example embodiments and thus are not intended to limit the scope of embodiments of the invention and the appended claims in any way.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of specific embodiments will so fully reveal the general nature of embodiments of the invention that others can, by applying knowledge within the skill of the art, readily modify and/or adapt for various applications such specific embodiments, without undue experimentation, without departing from the general concept of embodiments of the invention. Therefore, such adaptation and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the invention should not be limited by any of the above-described example embodiments, but should be defined only in accordance with the following claims and their equivalents.

What is claimed is:

1. A method for generating an integrated technical data package that incorporates a plurality of objects associated with a development of a product so that each object is integrated with the other objects based on a relationship between each of the objects, comprising:

incorporating into a technical data package database the plurality of objects, wherein the plurality of objects is specific to the development of the product and define physical characteristics of the product;

identifying a relationship between each of the plurality of objects based on an impact each of the objects has on each other in the development of the product;

integrating the plurality of objects based on the relationship between each of the objects so that an update to at least one object propagates through to each other object integrated with the at least one object;

generating the integrated technical data package to incorporate each update to each object so that each update is propagated through to each other integrated object to provide an updated snapshot of the development of the product;

generating a plurality of standard objects and incorporating the plurality of standard objects into the technical data package database, wherein the plurality of standard objects is pre-defined for the development of the product;

incorporating into the technical data package database from an entity specific database a plurality of entity specific objects, wherein the plurality of entity specific objects is specific to the development of the product by the entity;

identifying a relationship between each of the standard objects and the entity specific objects based on an impact each of the standard objects and the entity specific objects has on each other in the development of the product;

integrating the plurality of standard objects with the plurality of entity specific objects based on the relationship between each of the standard objects and the entity specific objects so that an update to at least one object propagates through to each other object integrated with the at least one object; and generating the integrated technical data package to incorporate each update to each object so that each update is propagated through to each other integrated object to provide an updated snapshot of the development of the product.

2. The method of claim 1, wherein the plurality of objects includes a plurality of standard objects that is pre-defined for the development of the product and a plurality of entity specific objects that is specific to the development of the product by an entity.

3. The method of claim 1, wherein the plurality of objects includes a plurality of features associated with the product and a plurality of characteristics so that each feature is associated with at least one characteristic that is a specification for each respective feature required in the development of the product.

4. The method of claim 3, further comprising:
receiving an update to at least one feature included in the plurality of features associated with the product;
propagating the update to the at least one feature to each characteristic associated with the at least one feature that is updated, wherein the update to the at least one feature has an impact on each characteristic associated with the at least one feature that is updated;
propagating the update to the at least one feature to each other feature integrated with the at least one feature, wherein the update to the at least one feature has an impact on each other feature integrated with the at least one feature that is updated; and
propagating the update to each characteristic associated with each other feature integrated with the at least one feature, wherein the update to the at least one feature has an impact on each other feature integrated with the at least one feature that is updated.

5. The method of claim 1, further comprising:
associating each object to at least one operation included in a plurality of operations so that each object is incorporated with at least one operation, wherein the plurality of operations includes each operation required to develop the product.

6. The method of claim 5, further comprising:
integrating the plurality of objects with the plurality of operations based on the association of each object to at least one operation included in the plurality of operations so that an update to at least one object propagates through to each operation that is impacted by the update to the at least one object;
generating the integrated technical data package to incorporate each update to each object so that each update is propagated through to each other integrated operation to provide the updated snapshot of the development of the product.

7. A method for generating an integrated technical data package that incorporates a plurality of objects associated with a development of a product so that each object is integrated with the other objects based on a relationship between each of the objects, comprising:
incorporating into a technical data package database the plurality of objects, wherein the plurality of objects is specific to the development of the product and define physical characteristics of the product;
identifying a relationship between each of the plurality of objects based on an impact each of the objects has on each other in the development of the product;
integrating the plurality of objects based on the relationship between each of the objects so that an update to at least one object propagates through to each other object integrated with the at least one object;
generating the integrated technical data package to incorporate each update to each object so that each update is propagated through to each other integrated object to provide an updated snapshot of the development of the product;
receiving a second plurality of objects that is specific to a development of a second product different from the first product;
querying the technical data package database for objects included in the plurality of objects previously incorporated into the technical data package database that are similar to the second plurality of objects that is specific to the development of the second product;
integrating the second plurality of objects based on the relationship between each of the objects included in the plurality of objects previously incorporated into the technical data package database that are similar to the second plurality of objects so that an update to at least one of the second plurality of objects propagates through to each of the other second plurality of objects integrated with the at least one of the second plurality of objects; and
generating a second integrated technical data package to incorporate each update to each of the second plurality of objects so that each update is propagated through to each of the other integrated second plurality of objects to provide an updated snapshot of the development of the second product.

8. A method for generating an integrated technical data package that incorporates a plurality of objects associated with a development of a product so that each object is integrated with the other objects based on a relationship between each of the objects, comprising:
incorporating into a technical data package database the plurality of objects, wherein the plurality of objects is specific to the development of the product and define physical characteristics of the product;
identifying a relationship between each of the plurality of objects based on an impact each of the objects has on each other in the development of the product;
integrating the plurality of objects based on the relationship between each of the objects so that an update to at least one object propagates through to each other object integrated with the at least one object;
generating the integrated technical data package to incorporate each update to each object so that each update is propagated through to each other integrated object to provide an updated snapshot of the development of the product;
extracting at least one object when a portion of a two-dimensional document associated with the development of the product is selected;
determining at least one selected feature associated with the at least one object selected when the portion of the two-dimensional document is selected and each selected characteristic associated with the at least one selected feature;
requesting a value be provided for each selected feature and associated selected characteristic that failed to have the value extracted from the two-dimensional document; and
incorporating the at least one selected feature and each selected characteristic and corresponding values into the integrated technical data package.

9. A method for generating an integrated technical data package that incorporates a plurality of objects associated with a development of a product so that each object is integrated with the other objects based on a relationship between each of the objects, comprising:
incorporating into a technical data package database the plurality of objects, wherein the plurality of objects is specific to the development of the product and define physical characteristics of the product;
identifying a relationship between each of the plurality of objects based on an impact each of the objects has on each other in the development of the product;
integrating the plurality of objects based on the relationship between each of the objects so that an update to at least one object propagates through to each other object integrated with the at least one object;
generating the integrated technical data package to incorporate each update to each object so that each update is propagated through to each other integrated object to provide an updated snapshot of the development of the product;
extracting at least one object when a portion of a three-dimensional model associated with the development of the product is selected;
determining at least one selected feature associated with the at least one object selected when the portion of the three-dimensional model is selected and each selected characteristic associated with the at least one selected feature;
automatically generating a value for each selected feature and associated selected characteristic that failed to have the value extracted from the three-dimensional model; and
incorporating the at least one selected feature and each selected characteristic and corresponding values into the integrated technical data package.

10. A system for generating an integrated technical data package that incorporates a plurality of objects associated with a development of a product so that each object is integrated with the other objects based on a relationship between each of the objects, comprising:
at least one processor; and
a memory coupled with the processor, the memory including instructions that, when executed by the processor cause the processor to:
incorporate into a technical data package database the plurality of objects, wherein the plurality of objects is specific to the development of the product and define physical characteristics of the product,
identify a relationship between each of the plurality of objects based on an impact each of the objects has on each other in the development of the product,
integrate the plurality of objects based on the relationship between each of the objects so that an update to at least one object propagates through to each other object integrated with the at least one object,
generate the integrated technical data package to incorporate each update to each object so that each update is propagated through to each other integrated object to provide an updated snapshot of the development of the product;
receive a second plurality of objects that is specific to a development of a second product different from the first product,
query the technical data package database for objects included in the plurality of objects previously incorporated into the technical data package database that are similar to the second plurality of objects that is specific to the development of the second product,
integrate the second plurality of objects based on the relationship between each of the objects included in the plurality of objects previously incorporated into the technical data package database that are similar to the second plurality of objects so that an update to at least one of the second plurality of objects propagates through to each of the other second plurality of objects integrated with the at least one of the second plurality of objects, and
generate a second integrated technical data package to incorporate each update to each of the second plurality of objects so that each update is propagated through to each of the other integrated second plurality of objects to provide an updated snapshot of the development of the second product.

11. The system of claim 10, wherein the plurality of objects includes a plurality of standard objects that is pre-defined for the development of the product and a plurality of entity specific objects that is specific to the development of the product by an entity.

12. The system of claim 11, wherein the processor is further configured to:
generate a plurality of standard objects and incorporating the plurality of standard objects into the technical data package database, wherein the plurality of standard objects is pre-defined for the development of the product;
incorporate into the technical data package database from an entity specific database a plurality of entity specific objects, wherein the plurality of entity specific objects is specific to the development of the product by the entity;
identify a relationship between each of the standard objects and the entity specific objects based on an impact each of the standard objects and the entity specific objects has on each other in the development of the product;
integrate the plurality of standard objects with the plurality of entity specific objects based on the relationship between each of the standard objects and the entity specific objects so that an update to at least one object propagates through to each other object integrated with the at least one object; and
generate the integrated technical data package to incorporate each update to each object so that each update is propagated through to each other integrated object to provide an updated snapshot of the development of the product.

13. The system of claim 10, wherein the plurality of objects includes a plurality of features associated with the product and a plurality of characteristics so that each feature is associated with at least one characteristic that is a specification for each respective feature required in the development of the product.

14. The system of claim 13, wherein the processor is further configured to:
receive an update to at least one feature included in the plurality of features associated with the product;
propagate through the update to the at least one feature to each characteristic associated with the at least one feature that is updated, wherein the update to the at least one feature has an impact on each characteristic associated with the at least one feature that is updated;
propagate through the update to the at least one feature to each other feature integrated with the at least one feature, wherein the update to the at least one feature has an impact on each other feature integrated with the at least one feature that is updated; and
propagate the update to each characteristic associated with each other feature integrated with the at least one feature, wherein the update to the at least one feature has an impact on each other feature integrated with the at least one feature that is updated.

15. The system of claim 10, wherein the processor is further configured to:
associate each object to at least one operation included in a plurality of operations so that each object is incorporated with at least one operation, wherein the plurality of operations includes each operation required to develop the product.

16. The system of claim 15, wherein the processor is further configured to:
    integrate the plurality of objects with the plurality of operations based on the association of each object to at least one operation included in the plurality of operations so that an update to at least one object propagates through to each operation that is impacted by the update to the at least one object; and
    generate the integrated technical data package to incorporate each update to each object so that each update is propagated through to each other integrated operation to provide the updated snapshot of the development of the product.

17. A system for generating an integrated technical data package that incorporates a plurality of objects associated with a development of a product so that each object is integrated with the other objects based on a relationship between each of the objects, comprising:
    at least one processor; and
    a memory coupled with the processor, the memory including instructions that, when executed by the processor cause the processor to:
        incorporate into a technical data package database the plurality of objects, wherein the plurality of objects is specific to the development of the product and define physical characteristics of the product;
        identify a relationship between each of the plurality of objects based on an impact each of the objects has on each other in the development of the product;
        integrate the plurality of objects based on the relationship between each of the objects so that an update to at least one object propagates through to each other object integrated with the at least one object;
        generate the integrated technical data package to incorporate each update to each object so that each update is propagated through to each other integrated object to provide an updated snapshot of the development of the product;
        extract at least one object selected when a portion of a two-dimensional document associated with the development of the product is selected;
        determine at least one selected feature associated with the at least one object selected when the portion of the two-dimensional document is selected and each selected characteristic associated with the at least one selected feature;
        request a value be provided for each selected feature and associated selected feature that failed to have the value extracted from the two-dimensional document; and
        incorporate the at least one selected feature and each selected characteristic and corresponding values into the integrated technical data package.

18. A system for generating an integrated technical data package that incorporates a plurality of objects associated with a development of a product so that each object is integrated with the other objects based on a relationship between each of the objects, comprising:
    at least one processor; and
    a memory coupled with the processor, the memory including instructions that, when executed by the processor cause the processor to:
        incorporate into a technical data package database the plurality of objects, wherein the plurality of objects is specific to the development of the product and define physical characteristics of the product;
        identify a relationship between each of the plurality of objects based on an impact each of the objects has on each other in the development of the product;
        integrate the plurality of objects based on the relationship between each of the objects so that an update to at least one object propagates through to each other object integrated with the at least one object;
        generate the integrated technical data package to incorporate each update to each object so that each update is propagated through to each other integrated object to provide an updated snapshot of the development of the product;
        extract at least one object selected when a portion of a three-dimensional mode associated with the development of the product is selected;
        determine at least one selected feature associated with the at least one object selected when the portion of the three-dimensional model is selected and each selected characteristic associated with the at least one selected feature;
        automatically generate a value for each selected feature and associated selected characteristic that failed to have the value extracted from the three-dimensional model; and
        incorporate the at least one selected feature and each selected characteristic and corresponding values into the integrated technical data package.

* * * * *